US008107912B2

(12) United States Patent
Tanaka et al.

(10) Patent No.: US 8,107,912 B2
(45) Date of Patent: *Jan. 31, 2012

(54) MOBILE COMMUNICATION APPARATUS

(75) Inventors: Satoshi Tanaka, Kokubunji (JP); Kazuo Watanabe, Takasaki (JP); Masao Hotta, Hannou (JP); Toyohiko Hongo, Musashimurayama (JP); Taizo Yamawaki, Tokyo (JP); Masumi Kasahara, Takasaki (JP); Kumiko Takikawa, Tama (JP)

(73) Assignees: Renesas Electronics Corporation, Kanagawa (JP); Tipcom Limited, Melbourn (GB)

( * ) Notice: Subject to any disclaimer, the term of this patent is extended or adjusted under 35 U.S.C. 154(b) by 0 days.

This patent is subject to a terminal disclaimer.

(21) Appl. No.: 12/975,488

(22) Filed: Dec. 22, 2010

(65) Prior Publication Data
US 2011/0092175 A1 Apr. 21, 2011

Related U.S. Application Data

(63) Continuation of application No. 12/056,576, filed on Mar. 27, 2008, now Pat. No. 7,885,626, which is a continuation of application No. 10/742,813, filed on Dec. 23, 2003, now Pat. No. 7,366,489, which is a continuation of application No. 09/711,105, filed on Nov. 14, 2000, now Pat. No. 6,826,388.

(30) Foreign Application Priority Data

Nov. 15, 1999  (JP) ..................... 11-323656

(51) Int. Cl.
*H04B 1/06* (2006.01)
*H04B 7/00* (2006.01)
*H04B 1/10* (2006.01)

(52) U.S. Cl. ................... 455/232.1; 455/234.1; 455/296
(58) Field of Classification Search .... 455/232.1–253.2, 455/296
See application file for complete search history.

(56) References Cited

U.S. PATENT DOCUMENTS
4,321,561 A    3/1982 Payne et al.
(Continued)

FOREIGN PATENT DOCUMENTS
DE    197 43 272    2/1999
(Continued)

OTHER PUBLICATIONS

K. Takakawa et al., "RF Circuits Technique of Dual-band Transceiver IC for GSM and DCS1800 Applications", IEEE 25th European Solid State Circuits Conference, 1999, pp. 278-281.
(Continued)

*Primary Examiner* — Simon Nguyen
(74) *Attorney, Agent, or Firm* — Mattingly & Malur, PC

(57) ABSTRACT

A transceiver suitable for larger scale of integration employs direct conversion reception for reducing the number of filters. Also, the number of VCOs is reduced by utilizing dividers to supply a receiver and a transmitter with locally oscillated signals at an RF band. Dividers each having a fixed division ratio are used for generating locally oscillated signals for the receiver, while a divider having a switchable division ratio are used for generating the locally oscillated signal for the transmitter. In addition, a variable gain amplifier for baseband signal is provided with a DC offset voltage detector and a DC offset canceling circuit for supporting high speed data communications to accomplish fast cancellation of a DC offset by eliminating intervention of a filter within a feedback loop for offset cancellation.

2 Claims, 18 Drawing Sheets

U.S. PATENT DOCUMENTS

| | | | |
|---|---|---|---|
| 4,633,223 | A | 12/1986 | Senderowicz |
| 4,731,796 | A | 3/1988 | Masterton et al. |
| 4,940,950 | A | 7/1990 | Helfrick |
| 5,179,730 | A | 1/1993 | Loper |
| 5,212,826 | A * | 5/1993 | Rabe et al. ............ 455/214 |
| 5,319,799 | A | 6/1994 | Morita |
| 5,471,665 | A * | 11/1995 | Pace et al. ............ 455/343.2 |
| 5,483,691 | A | 1/1996 | Heck et al. |
| 5,515,047 | A | 5/1996 | Yamakido et al. |
| 5,535,432 | A | 7/1996 | Dent |
| 5,617,060 | A | 4/1997 | Wilson et al. |
| 5,721,756 | A | 2/1998 | Liebetreu et al. |
| 5,724,653 | A * | 3/1998 | Baker et al. ............ 455/296 |
| 5,732,330 | A | 3/1998 | Anderson et al. |
| 5,739,720 | A | 4/1998 | Lee |
| 5,748,681 | A | 5/1998 | Comino et al. |
| 5,867,777 | A | 2/1999 | Yamaji et al. |
| 5,869,987 | A | 2/1999 | Tang |
| 5,896,562 | A | 4/1999 | Heinonen |
| 5,953,641 | A | 9/1999 | Auvray |
| 5,966,666 | A | 10/1999 | Yamaguchi et al. |
| 6,006,079 | A * | 12/1999 | Jaffee et al. ............ 455/310 |
| 6,009,126 | A * | 12/1999 | Van Bezooijen ............ 375/319 |
| 6,073,848 | A | 6/2000 | Giebel |
| 6,075,409 | A | 6/2000 | Khlat |
| 6,166,668 | A * | 12/2000 | Bautista et al. ............ 341/118 |
| 6,208,875 | B1 | 3/2001 | Damgaard et al. |
| 6,298,226 | B1 | 10/2001 | Lloyd et al. |
| 6,317,064 | B1 | 11/2001 | Ferrer et al. |
| 6,335,952 | B1 | 1/2002 | Lee et al. |
| 6,353,364 | B1 | 3/2002 | Klemmer |
| 6,356,217 | B1 | 3/2002 | Tilley et al. |
| 6,393,299 | B1 | 5/2002 | Mizumoto et al. |
| 6,449,264 | B1 | 9/2002 | Lehtinen et al. |
| 6,480,063 | B2 | 11/2002 | Ichihara |
| 6,484,014 | B1 | 11/2002 | Koszarsky |
| 6,498,929 | B1 * | 12/2002 | Tsurumi et al. ............ 455/296 |
| 6,516,187 | B1 | 2/2003 | Williams et al. |
| 6,560,447 | B2 | 5/2003 | Rahman |
| 6,714,765 | B1 | 3/2004 | Kimppa |
| 6,826,388 | B1 | 11/2004 | Tanaka et al. |
| 6,987,957 | B2 | 1/2006 | Suzuki et al. |
| 7,031,668 | B2 | 4/2006 | Darabi et al. |
| 7,035,351 | B1 | 4/2006 | Park et al. |
| 7,366,489 | B2 | 4/2008 | Tanaka et al. |
| 7,885,626 | B2 * | 2/2011 | Tanaka et al. ............ 455/234.1 |

FOREIGN PATENT DOCUMENTS

| | | |
|---|---|---|
| EP | 0 403 247 | 12/1990 |
| EP | 0 460 564 | 12/1991 |
| EP | 0678974 | 10/1995 |
| EP | 0 719 013 | 6/1996 |
| EP | 0800283 | 10/1997 |
| EP | 0 948 128 | 10/1999 |
| FR | 2316788 | 1/1997 |
| JP | 55-75313 | 6/1980 |
| JP | 3-16349 | 1/1991 |
| JP | 5-75495 | 3/1993 |
| JP | 6-303137 | 10/1994 |
| JP | 9-261106 | 3/1997 |
| JP | 09-130291 | 5/1997 |
| JP | 10-32520 | 2/1998 |
| JP | 10-200353 | 7/1998 |
| JP | 2000-286742 | 10/2000 |
| WO | WO 91/14311 | 9/1991 |
| WO | WO 95/30275 | 11/1995 |
| WO | WO 98/10523 | 3/1998 |

OTHER PUBLICATIONS

B. Razavi, "A 900-MHz CMOS Direct Conversion Receiver", IEEE Symposium on VLSI Circuits, 1997, pp. 113-114.

A. Abidi, "Direct-Conversion Radio Transceivers for Digital Communications", IEEE Journal of Solid-State Circuits, V. 30/N. 12, Dec. 1995, pp. 1399-1410.

* cited by examiner

FIG.12

| m | fIF$_G$ [MHZ] |
|---|---|
| 1 | 2820 |
| 2 | 970 |
| 4 | 45 |
| 8 | 417.5 |
| 16 | 648.75 |
| 32 | 764.375 |

FIG.13

| n | fIF$_D$ [MHZ] |
|---|---|
| 1 | 1900 |
| 2 | 95 |
| 4 | 807.5 |
| 8 | 1258.75 |
| 16 | 1484.375 |
| 32 | 1597.1875 |

GSM Spurious

| fIF[MHz] | 42 | 44 | 45 | 46 | 46 | 48 | 50 | 52 |
|---|---|---|---|---|---|---|---|---|
| m-> | 21 | 20 | 20 | 19 | 20 | 19 | 18 | 17 |
| fVCO[MHz] | | | | | | | | |
| 880 | 2 | 0 | 20 | 6 | 40 | 32 | 20 | 4 |
| 882 | 0 | 2 | 18 | 8 | 38 | 30 | 18 | 2 |
| 884 | 2 | 4 | 16 | 10 | 36 | 28 | 16 | 0 |
| 886 | 4 | 6 | 14 | 12 | 34 | 26 | 14 | 2 |
| 888 | 6 | 8 | 12 | 14 | 32 | 24 | 12 | 4 |
| 890 | 8 | 10 | 10 | 16 | 30 | 22 | 10 | 6 |
| 892 | 10 | 12 | 8 | 18 | 28 | 20 | 8 | 8 |
| 894 | 12 | 14 | 6 | 20 | 26 | 18 | 6 | 10 |
| 896 | 14 | 16 | 4 | 22 | 24 | 16 | 4 | 12 |
| 898 | 16 | 18 | 2 | 24 | 22 | 14 | 2 | 14 |
| 900 | 18 | 20 | 0 | 26 | 20 | 12 | 0 | 16 |
| 902 | 20 | 22 | 2 | 28 | 18 | 10 | 2 | 18 |
| 904 | 22 | 24 | 4 | 30 | 16 | 8 | 4 | 20 |
| 906 | 24 | 26 | 6 | 32 | 14 | 6 | 6 | 22 |
| 908 | 26 | 28 | 8 | 34 | 12 | 4 | 8 | 24 |
| 910 | 28 | 30 | 10 | 36 | 10 | 2 | 10 | 26 |
| 912 | 30 | 32 | 12 | 38 | 8 | 0 | 12 | 28 |
| 914 | 32 | 34 | 14 | 40 | 6 | 2 | 14 | 30 |

FIG.18

DCS/1800 Spurious

| fIF[MHz] | 84 | 86 | 88 | 90 | 92 | 94 | 96 | 98 | 100 | 102 | 104 | 106 |
|---|---|---|---|---|---|---|---|---|---|---|---|---|
| m-> | 21 | 20 | 20 | 19 | 19 | 19 | 18 | 18 | 17 | 17 | 17 | 16 |
| fVCO[MHz] | | | | | | | | | | | | |
| 1710 | 54 | 10 | 50 | 0 | 38 | 76 | 18 | 54 | 10 | 24 | 58 | 14 |
| 1714 | 50 | 6 | 46 | 4 | 34 | 72 | 14 | 50 | 14 | 20 | 54 | 18 |
| 1718 | 46 | 2 | 42 | 8 | 30 | 68 | 10 | 46 | 18 | 16 | 50 | 22 |
| 1722 | 42 | 2 | 38 | 12 | 26 | 64 | 6 | 42 | 22 | 12 | 46 | 26 |
| 1726 | 38 | 6 | 34 | 16 | 22 | 60 | 2 | 38 | 26 | 8 | 42 | 30 |
| 1730 | 34 | 10 | 30 | 20 | 18 | 56 | 2 | 34 | 30 | 4 | 38 | 34 |
| 1734 | 30 | 14 | 26 | 24 | 14 | 52 | 6 | 30 | 34 | 0 | 34 | 38 |
| 1738 | 26 | 18 | 22 | 28 | 10 | 48 | 10 | 26 | 38 | 4 | 30 | 42 |
| 1742 | 22 | 22 | 18 | 32 | 6 | 44 | 14 | 22 | 42 | 8 | 26 | 46 |
| 1746 | 18 | 26 | 14 | 36 | 2 | 40 | 18 | 18 | 46 | 12 | 22 | 50 |
| 1750 | 14 | 30 | 10 | 40 | 2 | 36 | 22 | 14 | 50 | 16 | 18 | 54 |
| 1754 | 10 | 34 | 6 | 44 | 6 | 32 | 26 | 10 | 54 | 20 | 14 | 58 |
| 1758 | 6 | 38 | 2 | 48 | 10 | 28 | 30 | 6 | 58 | 24 | 10 | 62 |
| 1762 | 2 | 42 | 2 | 52 | 14 | 24 | 34 | 2 | 62 | 28 | 6 | 66 |
| 1766 | 2 | 46 | 6 | 56 | 18 | 20 | 38 | 2 | 66 | 32 | 2 | 70 |
| 1770 | 6 | 50 | 10 | 60 | 22 | 16 | 42 | 6 | 70 | 36 | 2 | 74 |
| 1774 | 10 | 54 | 14 | 64 | 26 | 12 | 46 | 10 | 74 | 40 | 6 | 78 |
| 1778 | 14 | 58 | 18 | 68 | 30 | 8 | 50 | 14 | 78 | 44 | 10 | 82 |
| 1782 | 18 | 62 | 22 | 72 | 34 | 4 | 54 | 18 | 82 | 48 | 14 | 86 |
| 1785 | 21 | 65 | 25 | 75 | 37 | 1 | 57 | 21 | 85 | 51 | 17 | 89 |

Total frequency range of RFVCO
= 3.61 – 3.84 GHz(230 MHz, 6.2%)

Total frequency range of RFVCO
= 3.61 – 4.00 GHz(390 MHz, 10.2%)

MOBILE COMMUNICATION APPARATUS

This is a continuation application of U.S. application Ser. No. 12/056,576, filed Mar. 27, 2008, now allowed, which is a continuation of U.S. application Ser. No. 10/742,813, filed Dec. 23, 2003, now U.S. Pat. No. 7,366,489, which is a continuation of U.S. application Ser. No. 09/711,105, filed Nov. 14, 2000, now U.S. Pat. No. 6,826,388.

BACKGROUND OF THE INVENTION

1. Field of the Invention

The present invention relates generally to a mobile communication apparatus which can be implemented with a less number of components, and more particularly, to a transceiver which employs a direct conversion scheme suitable for larger scale of integration.

2. Description of the Related Art

With explosive popularization of mobile communication apparatus, requirements for a reduction in size and cost have been increased. For this reason, it is desired to eliminate VCO (voltage controlled oscillator), reduce the number of filters, and apply integrated circuits with a higher degree of integration. A prior art example of a transceiver which meets such requirements is described in K. Takikawa et. al., "RF Circuits Technique of Dual-Band Transceiver IC for GSM and DCS1800 applications," IEEE 25$^{th}$ European Solid-State Circuits Conference Preprints pp. 278-281, 1999. The configuration of this transceiver is illustrated in FIG. 10A. The illustrated transceiver comprises an integrated circuit 1016, and other components 1001-1015 which are connected external to the integrated circuit 1016. The prior art example supports two frequency bands, i.e., 900 MHz band and 1.8 GHz band. Also, the transceiver employs a superheterodyne scheme for a receiver and an offset PLL scheme for a transmitter. The superheterodyne receiver requires two RF (high frequency) filters 1001, 1002 for suppressing out-of-band blocker signals; two image rejection filters 1003, 1004 for rejecting blocker signals in an image frequency band associated with mixing; and an IF (intermediate frequency) filter 1005 for filtering out blocker signals near a reception channel. The receiver also requires two local oscillators 1006, 1007 for supporting the two frequency bands, i.e., 900 MHz band and 1.8 GHz band.

A reception scheme which can reduce the number of externally connected components is a direct conversion scheme. A prior art example of a direct conversion receiver is described in Behzad Razavi, "A 900-MHz CMOS Direct Conversion Receiver," IEEE Symposium on VLSI Circuits, pp. 113-114, 1997. The configuration of this receiver is illustrated in FIG. 10B. Since no image response exists in principle, the direct conversion scheme does not require an image rejection filter. Also, an IF filter is eliminated since it can be replaced by a filter integrated in an IC. In this prior art example, a VCO 1025 oscillates at a frequency twice an input frequency of the receiver which is in a range of 1850-1920 MHz. When this receiver is applied to GSM, DCS1800 dual band receiver, the VCO 1025 must oscillate in a range of 1850 to 1920 MHz (for GSM) and in a range of 3610 to 3760 MHz (for DCS1800). However, since it is difficult for a single VCO to cover these frequency bands, two VCOs are required.

A widely known drawback of the direct conversion receiver is a DC offset voltage. This is generated because an input signal to mixers 1019, 1020 is equal to a locally oscillated signal in frequency. For example, if the locally oscillated signal leaks into an input terminal for an input signal, locally oscillated signals are mutually multiplied to generate DC offset voltage. A prior art example of a scheme for canceling the DC offset voltage is described in Asad A. Abidi et. al., "Direct-Conversion Radio Transceivers for Digital Communications," IEEE Journal of Solid-State Circuits, pp. 1399-1410, vol. 30, no. 12. December 1995. The configuration of this transceiver is illustrated in FIG. 11. An output DC offset voltage of a variable gain amplifier composed of variable gain amplifiers 1101, 1103, 1105 and low pass filters 1102, 1104 is detected by a digital signal processor (DSP) 1106. The DSP 1106 outputs a DC offset voltage cancel signal to an input of the variable gain amplifier 1101 based on the detected information.

SUMMARY OF THE INVENTION

As described above, in the direct conversion receiver, the number of externally connected filters can be reduced. However, if the direct conversion receiver is used in place of the superheterodyne receiver in the GSM, DCS1800 dual band transceiver of FIG. 10A, the number of local oscillators is increased. This is because the transmitter requires a locally oscillated frequency in a range of 1150 to 1185 MHz (for GSM) and in a range of 1575 to 1650 MHz (for DCS1800), and the receiver requires a locally oscillated frequency in a range of 1850 to 1920 MHz (for GSM) and in a range of 3610 to 3760 MHz (for DCS1800), but a single VCO encounters difficulties in covering a plurality of bands. For a further reduction in cost, a reduction in the number of VCOs is a primary subject.

Also, in GPRS (General Packet Radio Service) which implements high speed data communications based on a GSM system, a plurality of slots are assigned to reception and transmission. Thus, fast DC offset voltage cancellation is required. In addition, the DC offset voltage cancellation must be performed every operation frame. First, the necessity for the fast offset cancellation is explained with reference to FIG. 4. One frame of GSM is comprised of eight slots, each of which has a duration of 577 μm. Assume herein a severe condition for the DC offset voltage cancellation, in which four slots are assigned to the reception (RX), and one slot is assigned to the transmission (TX). While a transmission slot TX1' is assigned to a slot 7, the transmission slot TX1' is transmitted at a timing of TX1, which is 237 μsec before the slot 7, in consideration of a propagation delay to a base station. Also, a monitoring period of approximately 500 μsec and a PLL synchronizing period are required other than transmission and reception. Assuming that the PLL synchronizing period lasts approximately 150 μsec, a time available for canceling the DC offset voltage, in which a transceiver does not operate, is calculated as 1154−500−237−150*2=117 μsec, thus requiring fast DC offset cancellation.

Next, the necessity for the offset cancellation performed every frame is explained with reference to FIG. 5. FIG. 5 shows a measuring circuit for measuring a received frequency dependency of an output DC offset voltage of a mixer, and the result of a measurement made thereby. The result of the measurement reveals that the output DC offset voltage has the frequency dependency. Therefore, in a system such as GSM, DCS1800, in which a received frequency is not fixed during a call but the frequency hops within a reception band, it is difficult to previously anticipate the DC offset voltage. Therefore, the DC offset voltage must be canceled every operation frame.

The scheme employed in the example of FIG. 11 is not suitable for high speed data communications since a filter intervening in a feedback loop for offset cancellation make the fast offset cancellation difficult. Therefore, the realization of a fast offset canceling scheme suitable for high speed data communications is a second subject.

To realize the first subject, in the present invention, a receiver and a transmitter are supplied with locally oscillated signals in an RF band from a single VCO utilizing dividers. Dividers each having a fixed division ratio are used for generating the locally oscillated signals for the receiver, while a divider having a switchable division ratio is used for generating the locally oscillated signal for the transmitter.

To realize the second subject, in the present invention, a variable gain amplifier for baseband signal is provided with a DC offset voltage detector and a DC offset canceling circuit to accomplish fast cancellation of a DC offset by eliminating intervention of a filter within a feedback loop for offset cancellation.

BRIEF DESCRIPTION OF THE DRAWINGS

FIG. 12 is a table showing IF frequencies of a transmitter for use in a GSM operation;

FIG. 13 is a table showing IF frequencies of the transmitter for use in a DCS1800 operation;

FIG. 18 is a table listing spurious in DSC1800 transmission;

DETAILED DESCRIPTION OF THE EMBODIMENTS

Figure 1:
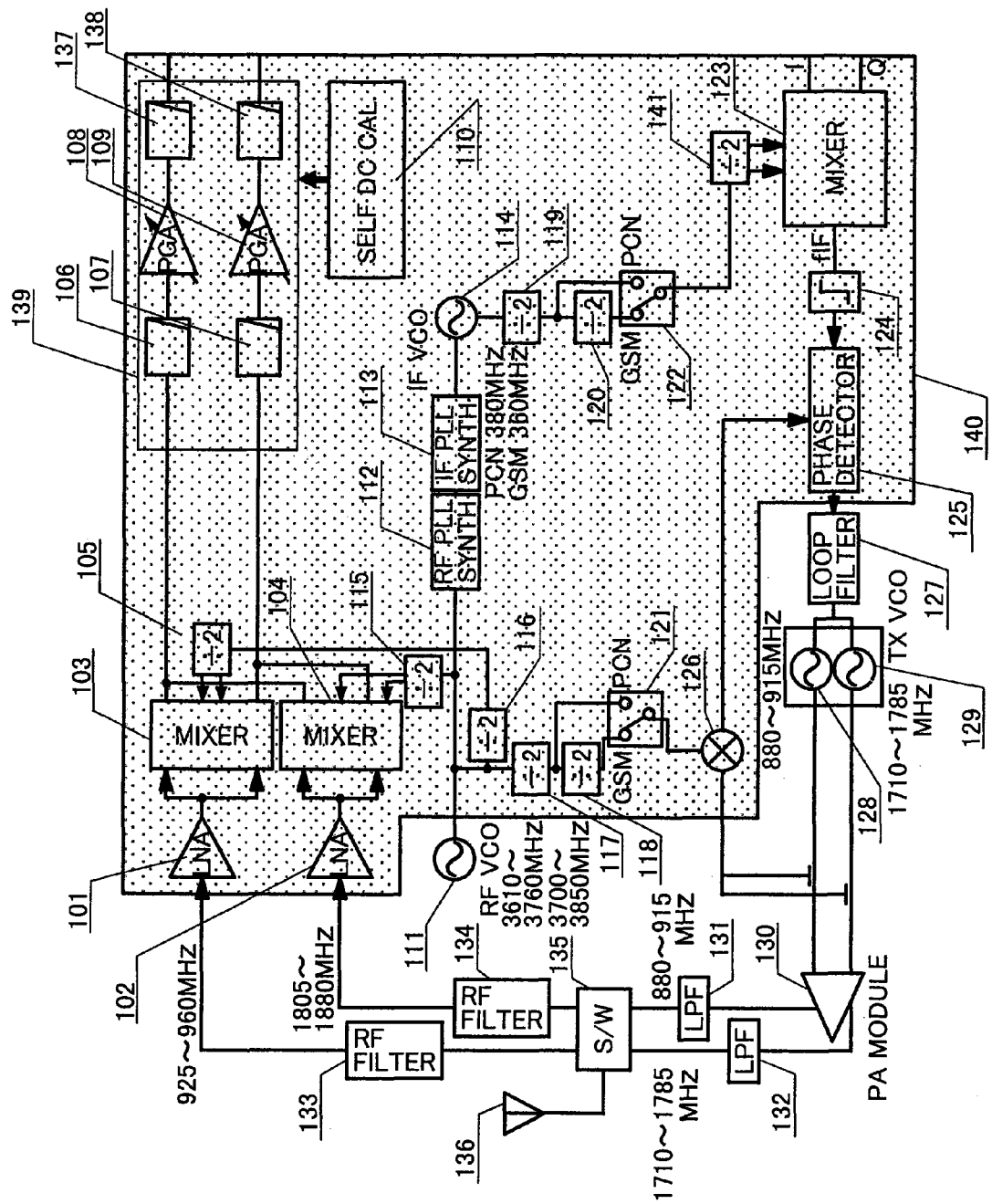
FIG. 1 is a block diagram illustrating the configuration of a mobile communication apparatus according to a first embodiment of the present invention.

A first embodiment of the present invention will be described with reference to FIG. 1. The first embodiment uses an exemplary mobile communication apparatus, as an application, which supports the European cellular telephone GSM (900 MHz band) and DCS1800 (1800 MHz band).

A direct conversion scheme is applied to a receiver for converting an RF signal directly to a baseband signal, and the offset PLL scheme, previously shown in the prior art example, is applied to a transmitter. The receiver comprises low noise amplifiers 101, 102; mixers 103, 104; and a variable gain low pass filter 139. Each of the mixers converts a signal frequency band from the RF band to the baseband, and simultaneously performs demodulation for separating an RF signal into a sine component and a cosine component. For this purpose, the mixers 103, 104 must be applied with locally oscillated signals which are shifted in phase by 90°. The locally oscillated signals are generated using dividers 105, 115. The locally oscillated signals are generated by a PLL loop formed of a VCO 111 and a PLL 112. When a VCO for oscillating in a 3600 MHz band is used for the VCO 111, the output of the divider 115 is in a 1800 MHz band and provides a locally oscillated signal for DCS1800. Also, as the divider 116 is positioned prior to the divider 105, an output frequency of the divider 105 is in a 900 MHz band and provides a locally oscillated signal for GSM. Output baseband signals of the mixers 103, 104 are inputted to a variable gain low pass filter 139 for level adjustment and blocker signal rejection. The variable gain low pass filter 139 comprises low pass filters 106, 107, 137, 138, and variable gain amplifiers 108, 109. Also, for suppressing a DC offset voltage at the output of the variable gain low pass filter 139, a DC offset voltage canceling circuit 110 is provided. The DC offset voltage canceling circuit 110 has a DC offset voltage detecting unit and a DC offset canceling unit.

For reducing the number of externally connected components, the transmitter also uses the same VCO 111 as the receiver. How to determine an IF frequency (fIF) used in the transmitter is explained below. Assume that reception frequencies received at an antenna 136 are $fr_G$ (for GSM) and $fr_D$ (for DCS1800); and a transmission frequencies are $ft_G$ (for GSM) and $ft_D$ (for DCS1800). As described above, since the oscillating frequency of the VCO 111 is four times the GSM reception frequency and twice the DSC1800 reception frequency, the oscillating frequency of the VCO 111 can be expressed as $4 \cdot fr_G = 2 \cdot fr_D$. When signals generated by dividing this oscillating frequency by m (GMS) and by n (DCS1800) are used as locally oscillated signals for a mixer 126 of an offset PLL, an IF frequency $fIF_G$ for GSM is expressed by the following equation 1:

$$fIF_G = \left| \frac{4 \cdot fr_G}{m} - ft_G \right| \qquad \text{equation 1}$$

Similarly, an IF frequency fIF$_D$ for DCS1800 is expressed by the following equation 2:

$$fIF_D = \left| \frac{2 \cdot fr_D}{n} - ft_D \right| \quad \text{equation 2}$$

Assume herein that fr$_G$=925 MHz, ft$_G$=880 MHz, fr$_D$=1805 MHz, and ft$_D$=1710 MHz. The IF frequency fIF$_G$ calculated for m is shown in FIG. 12, and the IF frequency fIF$_D$ calculated for n is shown in FIG. 13. Since a divide-by-two divider is used for the frequency division, 2 to the i-th power (i is an integer number) is used for m and n. For employing a single VCO for generating the IF frequencies, m and n cannot be freely selected but must be selected such that fIF$_G$ is substantially equal to fIF$_D$. Also, when a divide-by-two divider is used, the ratio of fIF$_G$ to fIF$_D$ may be substantially equal to 2 to the j-th power (j is an integer number). Here, "substantially equal" means that the two frequencies may be included within an oscillating frequency range of the VCO even if they are not exactly the same. In FIGS. 12 and 13, combinations of m and n which satisfy the foregoing condition are (m, n)=(2, 1) and (4, 2). The IF frequencies fIF are eventually determined from such combinations of m and n in consideration of power consumption, the presence or absence of generation of an unwanted spurious signal, and so on. In this embodiment, a combination (m, n)=(4,2) is chosen. Dividers 117, 118 and a change-over switch 121 are provided subsequent to the VCO 111, and are controlled to divide the output frequency of VCO 111 by four for GSM and by two for DCS1800. Next, the oscillating frequency of the VCO 114 is determined depending on the power consumption, the scale of passive elements contained in IC, and so on. In this embodiment, the oscillating frequency of the VCO 114 is divided by eight for GSM and by four for DCS1800 to generate fIF$_G$=45 MHz and fIF$_D$=95 MHz by selecting the oscillating frequency in a 300 MHz band and providing dividers 119, 120 and a change-over switch 122 subsequent to the VCO 114.

Figure 17:
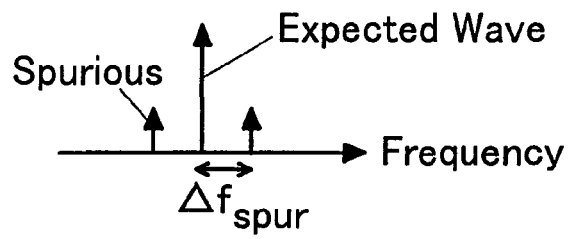
FIG. 17 is a table listing spurious in GSM transmission.

Next, the problem of spurious will be explained in a more specific manner. FIGS. 17, 18 show the spurious when the IF frequency is fixed, and the locally oscillated frequency is changed. FIGS. 17, 18, which correspond to GSM and DSC1800, show the spurious which results from the difference between an integer multiple (multiplied by m) of the IF frequency and the locally oscillated frequency when transmission signals are generated from transmission oscillators 128, 124. In the tables, fIF represents the IF frequency, and fVCO the transmission frequency. A numerical value written in each field shows the difference between a spurious signal and the transmission frequency in units of MHz. Hatched fields indicate the spurious generated nearby within 10 MHz, which are not easily removed by a loop filter 127 of the transmitter. As will be understood from FIGS. 17, 18, when the IF frequency is fixed, it is difficult to avoid a region in which the spurious appears near the transmission frequency within the transmission band, and the effectiveness of varying the IF frequency depending on the transmission frequency is understandable. For example, in the example of GSM shown in FIG. 17, the spurious can be avoided by selecting the IF frequency at 45 MHz from 880 MHz to 888 MHz and selecting the IF frequency at 46 MHz from 888 MHz to 914 MHz.

Figure 16:
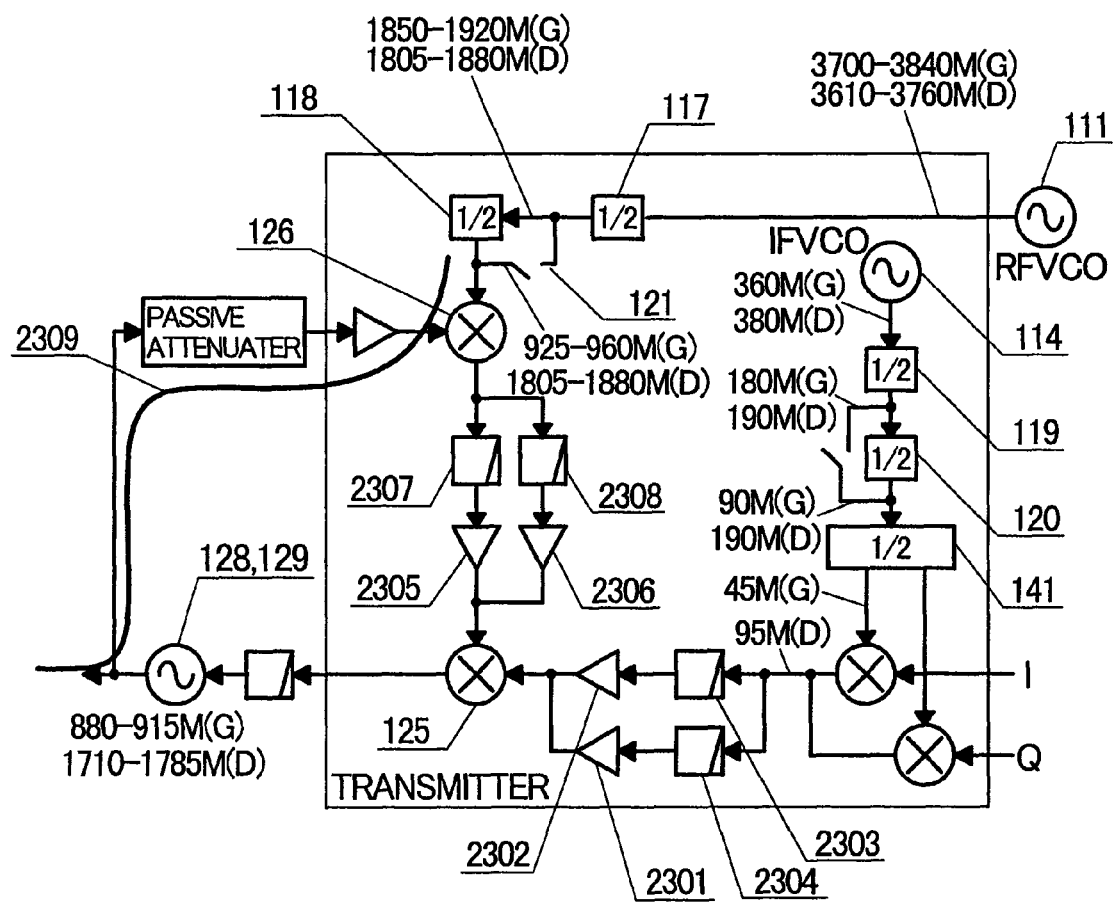
FIG. 16 is a block diagram illustrating a GSM/DCS1800 dual band transmitter.
Figure 19:
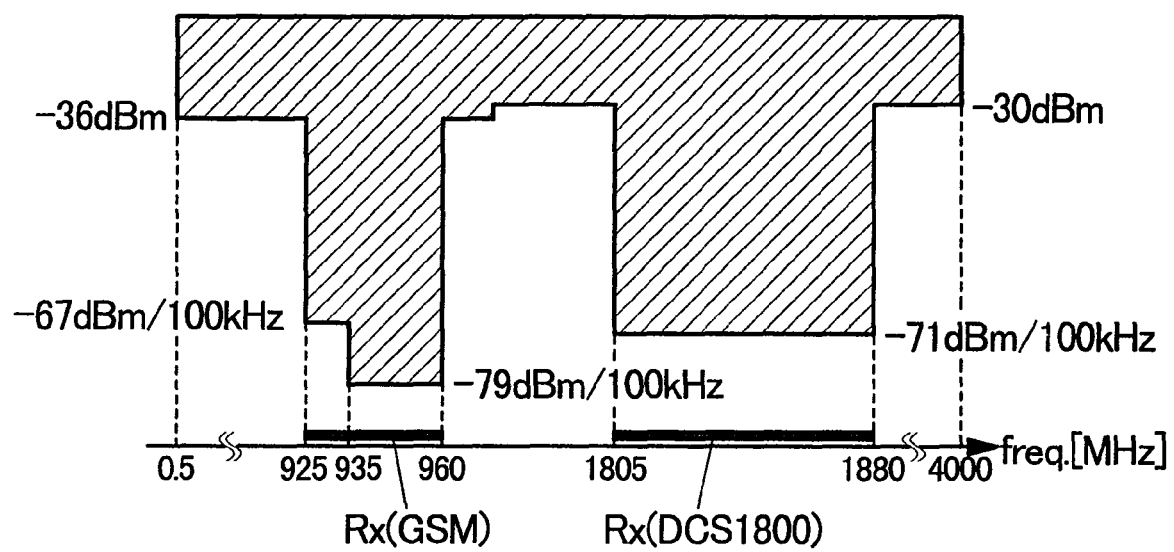
FIG. 19 shows a GSM spurious standard.
Figure 20:
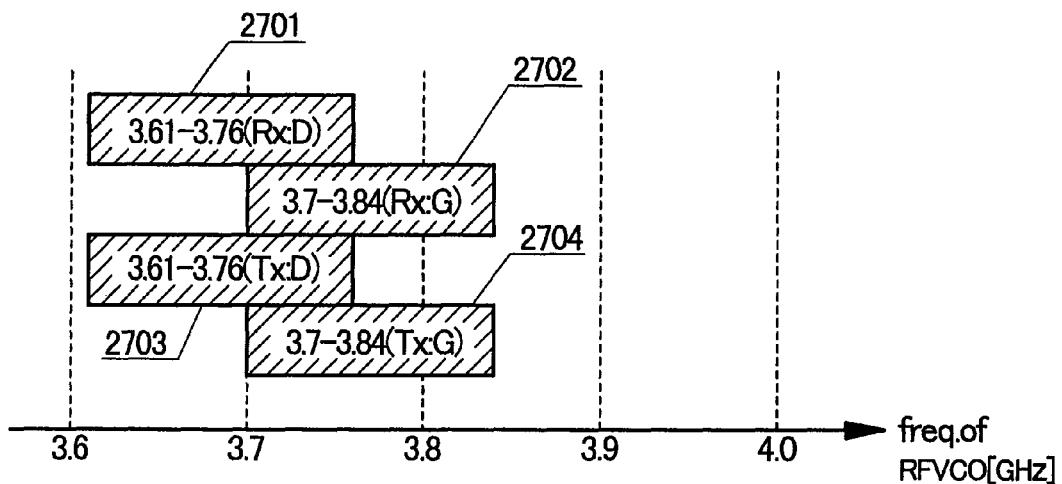
FIG. 20 shows allocation of VCO oscillating frequencies in which locally oscillated frequency bands are coincident for transmission and reception.
Figure 21:
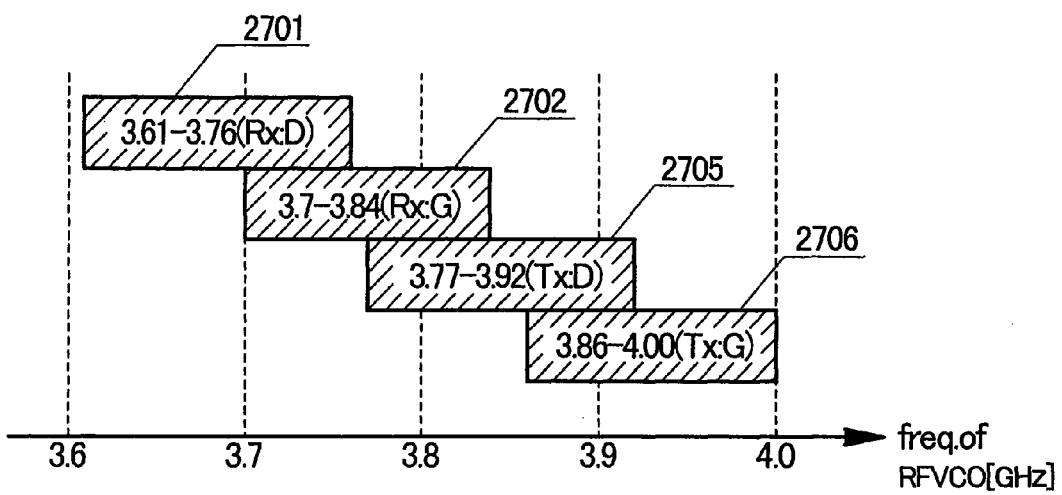
FIG. 21 shows allocation of VCO oscillating frequencies in which locally oscillated frequency bands do not overlap for transmission and reception.

In this embodiment, the locally oscillated signal applied to the mixer 126 in the transmitter exists within the reception band. FIG. 16 illustrates the transmitter of this embodiment in an enlarged view. The locally oscillated signal existing within the reception band leaks through a path designated by 2309, and amplified by an amplifier at a later stage and irradiated. A standard related to the irradiation of the spurious in GSM is summarized in FIG. 19. While the spurious within the reception band is allowed only at five points and at a level of −36 dBm or lower, it is desired to suppress the spurious to −79 dBm/100 kHz in principle. FIG. 20 summarizes the oscillating frequencies of the VCO so far explained in the foregoing embodiment. A reception band 2701 and a transmission band 2703 for DCS1800 are coincident, and a reception band 2702 and a transmission band 2704 for GSM are coincident as well. For shifting these bands from each other, consider a frequency allocation as shown in FIG. 21. A transmission band 2705 shifted from the reception band 2701 for DCS1800 does not overlap the reception band 2701, so that the leakage of the locally oscillated frequency within the reception band during transmission can be avoided. The same is applied to GSM as well.

Figure 2:
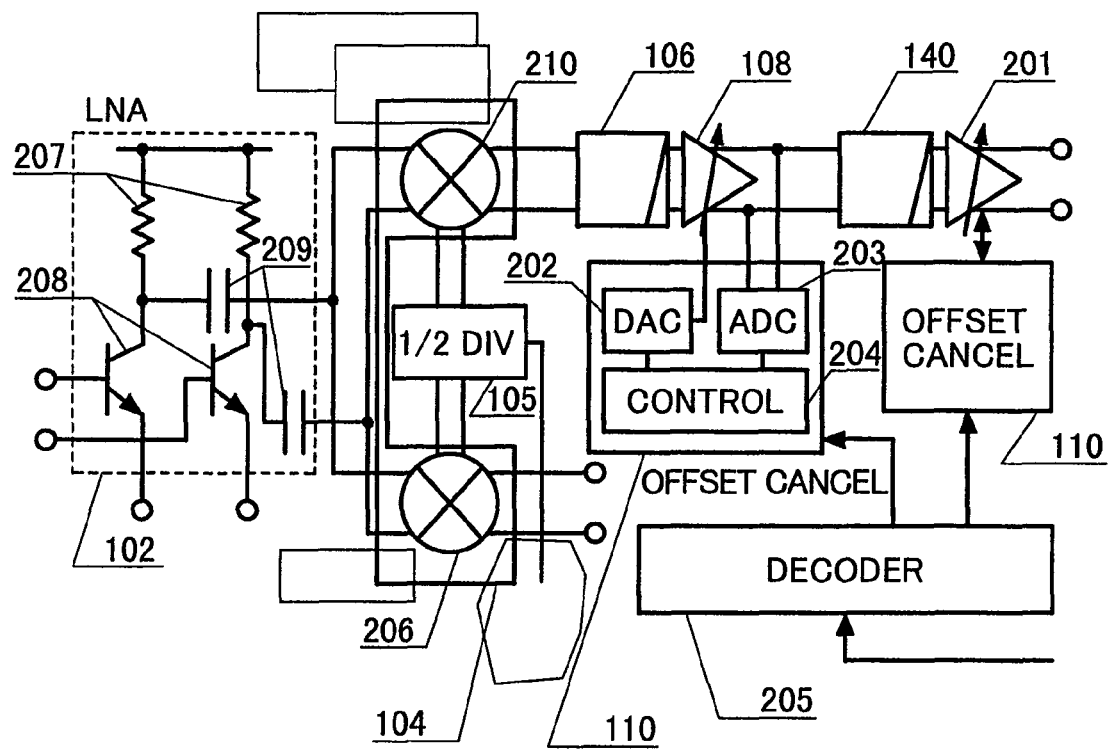
FIG. 2 is a block diagram illustration a receiver of the mobile communication apparatus according to the present invention.

Next, a receiver according to a second embodiment of the present invention will be described with reference to FIG. 2.

The illustrated receiver comprises a low noise amplifier 102; a mixer 104; a divider 105; low pass filters 106, 137; variable gain amplifiers 108, 201; DC offset voltage canceling circuits 110; and a decoder 205. The low noise amplifier 102 in turn comprises a load resistor 207; a transistor 208; and a capacitance 209, while the DC offset voltage canceling circuit 110 comprises a digital-to-analog converter (DAC) 202; an analog-to-digital converter (ADC) 203; and a controller 204. The mixer 104 comprises mixers 210, 206.

An output DC voltage of the variable gain amplifier 108 is converted to a digital signal by the ADC 203, and inputted to the controller 204. The controller 204 measures the DC offset voltage at the output of the variable gain amplifier 108 to output a cancel signal for canceling the DC offset voltage. The cancel signal is converted from a digital signal to an analog signal by the DAC 202, and an output signal of the DAC 202 cancels the DC offset voltage of the variable gain amplifier 108. The decoder 205 selects one of the DC offset voltage canceling circuits 110, such that only the selected circuit is operative. In this way, since no filter intervenes within a feedback loop comprised of the variable gain amplifier and the DC offset voltage canceling circuit, a delay otherwise caused by the filter is eliminated, thereby making it possible to realize fast offset cancellation. Here, it is also possible to employ a one-bit ADC, i.e., a simple comparator.

Figure 3:
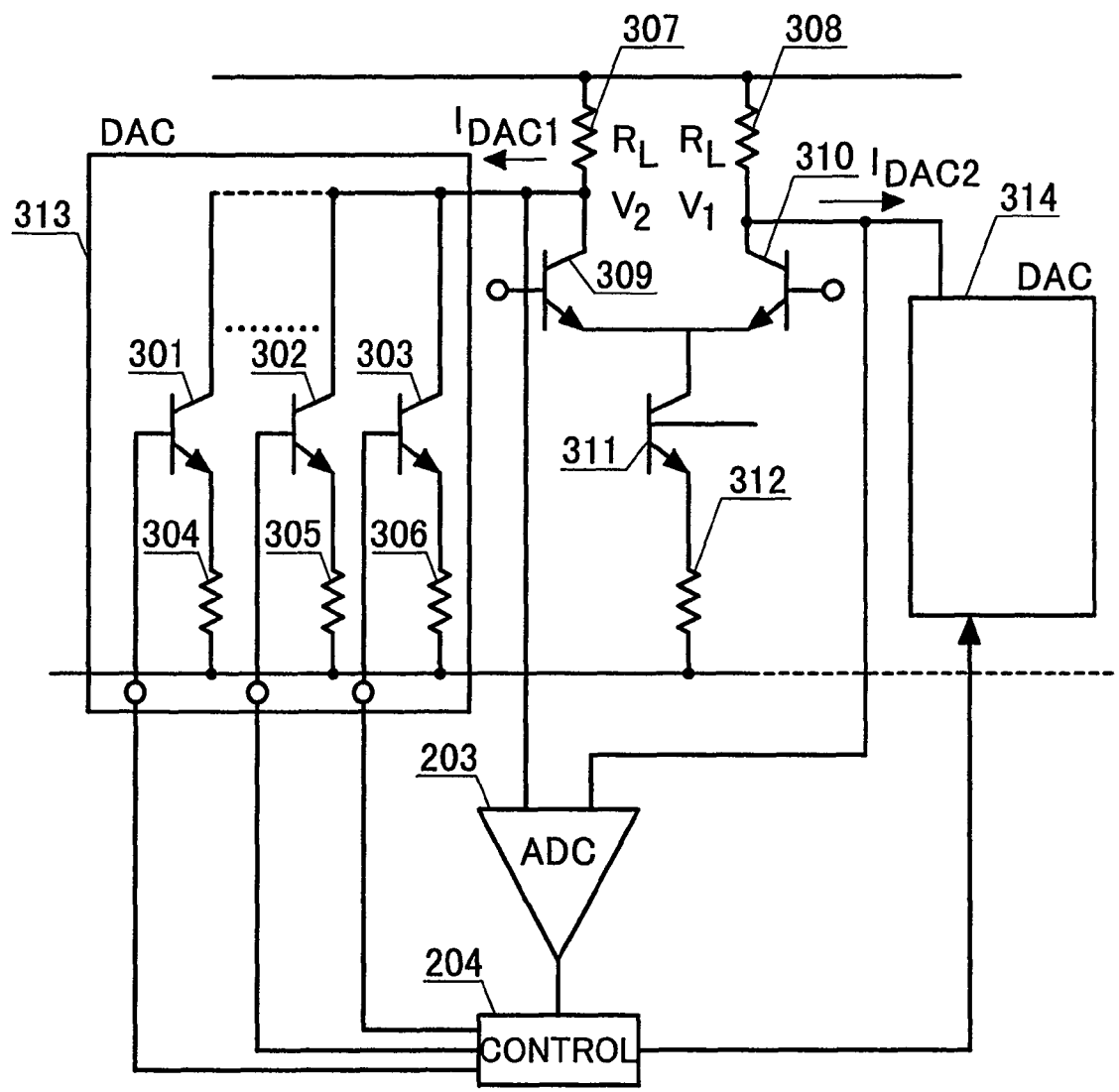
FIG. 3 is a circuit diagram illustrating in detail a circuit for removing a DC offset of a receiver according to the present invention.
Figure 4:
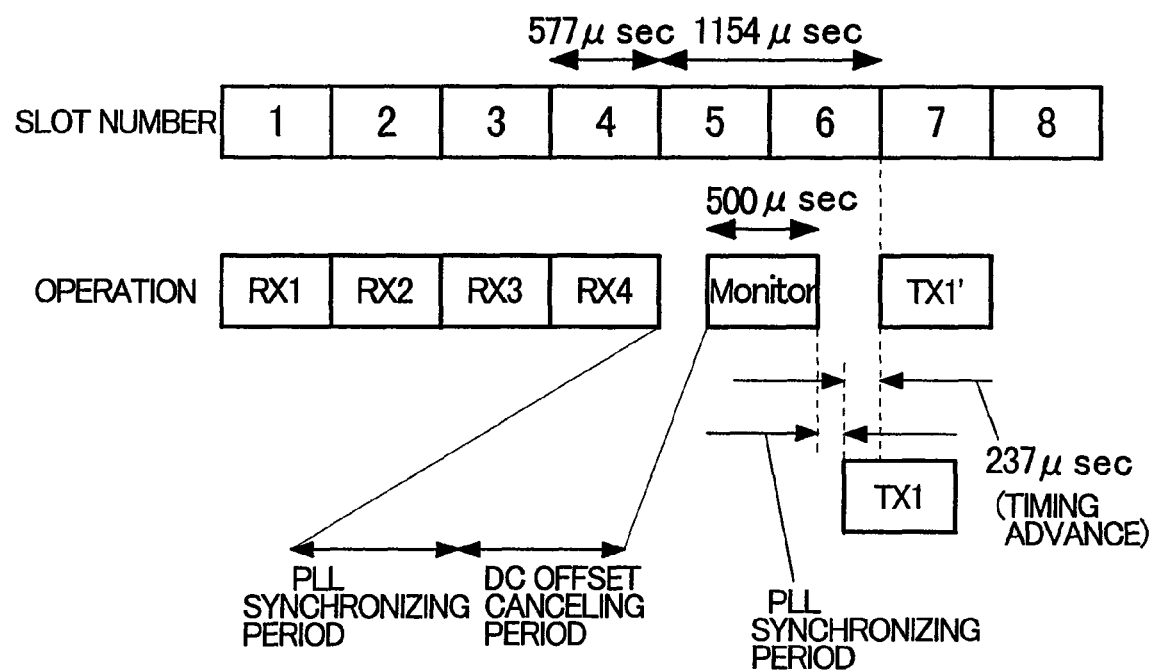
FIG. 4 is an operation timing diagram in a GSM standard.
Figure 5:
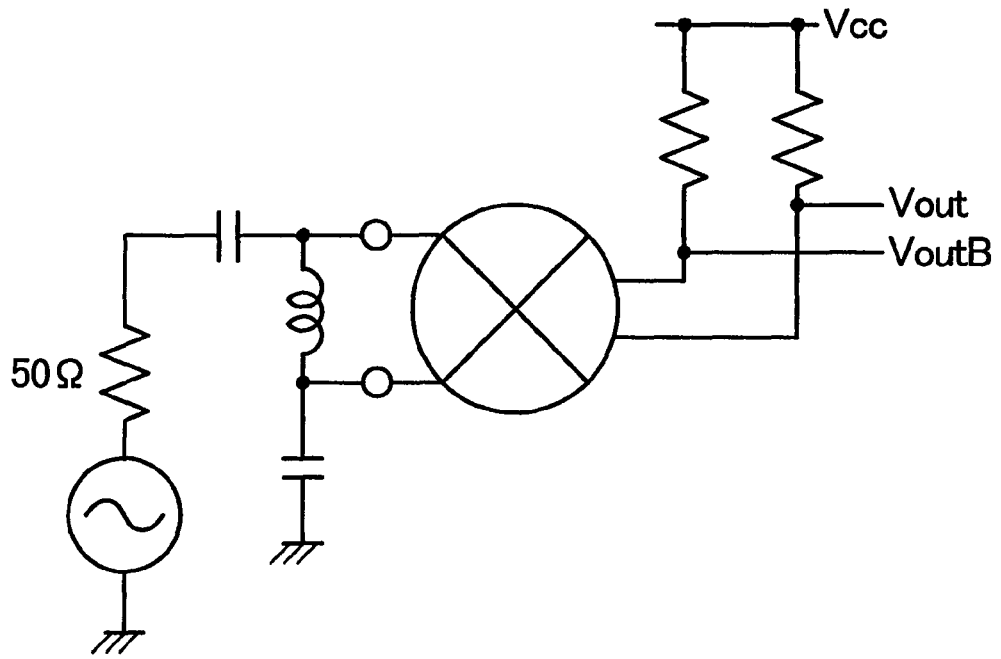
FIG. 5 shows a method of measuring a DC offset voltage generated by a mixer, and the result of a measurement made by the method.
Figure 5:
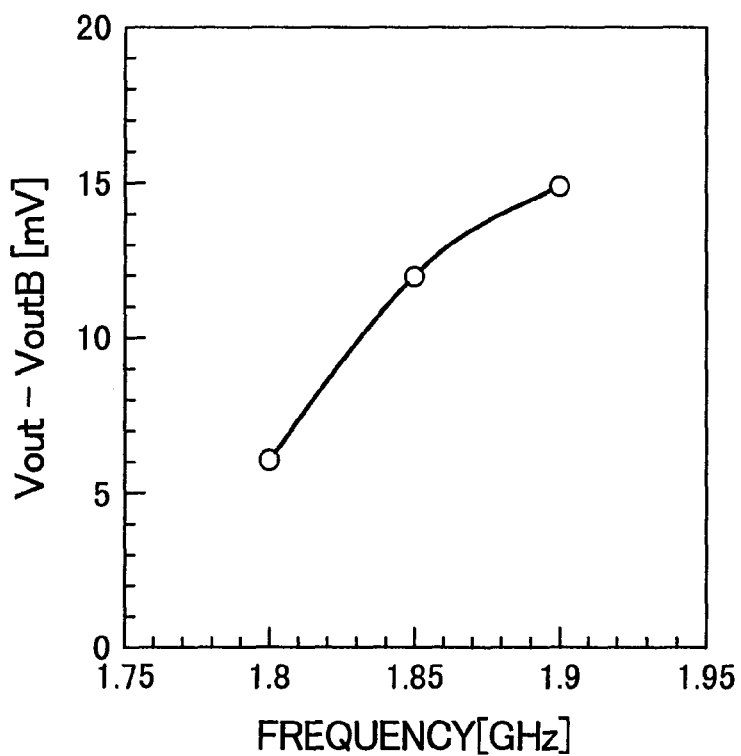

Next, a variable gain amplifier and a DC offset voltage canceling circuit according to a third embodiment of the present invention will be described with reference to FIG. 3.

The variable gain amplifier comprises resistors 307, 308, 312; and transistors 309, 310, 311. The transistors 309, 310 are applied with an input voltage at their bases to deliver output voltages from their collectors. The gain can be controlled, for example, by a base voltage of the transistor 311. A DAC 313 comprises transistors 301, 302, 303; and resistors 304, 305, 306. Since the output of a controller 204 is connected to bases of the transistors 301, 302, 303, the controller 204 can control collector DC currents of the transistors 301, 302, 303. The collector DC currents are summed with a collector current of the transistor 309, and then converted to a voltage by the resistor 307. Assume now that a DC offset voltage $\Delta V$ (=$V_2-V_1$) exists, and the resistance of the resistors 307, 308 are represented by $R_L$; an output DC current of the DAC 313 by $I_{DAC1}$; and an output DC current of the DAC 314 by $I_{DAC2}$. In this event, the controller 204 controls the DACs 313, 314 to satisfy the relationship expressed by equation 3:

$$R_L \cdot (I_{DAC1} - I_{DAC2}) = \Delta V \qquad \text{equation 3}$$

Figure 6A:
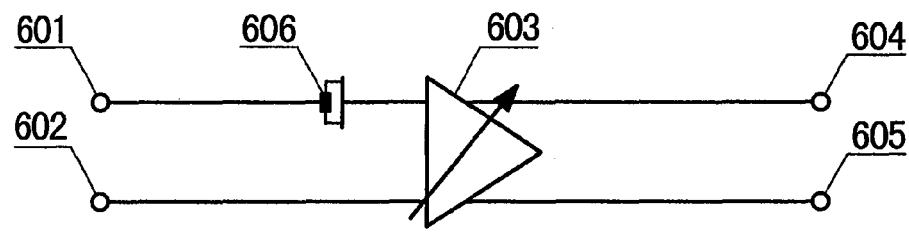
FIGS. 6A, 6B, 6C are diagrams illustrating the principles of the operation of a chopper amplifier which can be applied to the present invention.
Figure 6B:
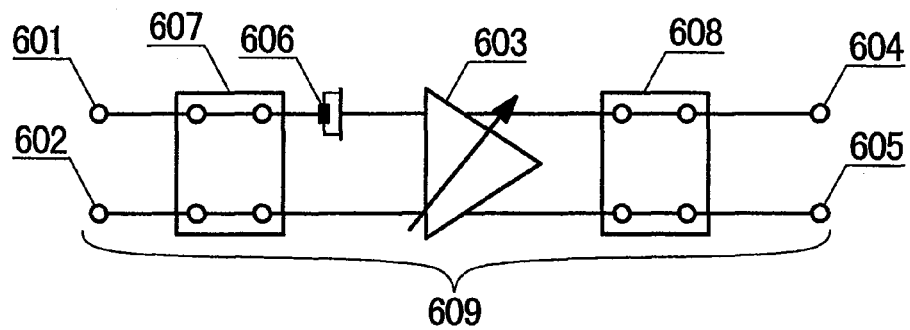
Figure 6C:
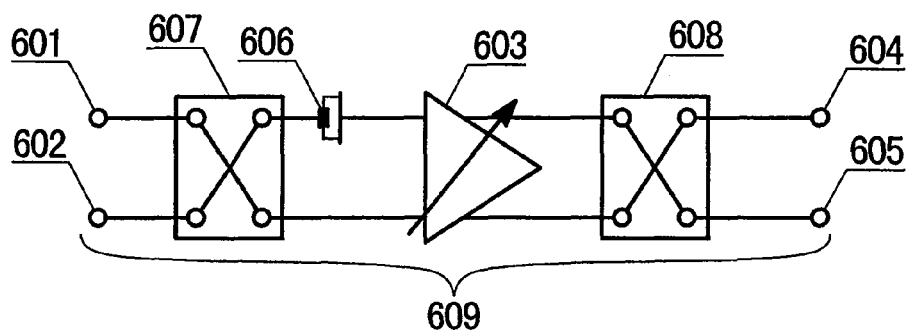

Next, a variable gain amplifier according to a fourth embodiment of the present invention will be described with reference to FIGS. 6A-6C. FIG. 6A illustrates an ideal variable gain amplifier 603 free from a DC offset voltage, and an input conversion DC offset voltage source 606 for the variable gain amplifier 603. In this configuration, since no means is provided for suppressing an offset voltage, an output voltage of the offset voltage source 606 multiplied by the gain of the variable gain amplifier 603 appears as an offset between output terminals 604, 605. Next, FIGS. 6B, 6C illustrate configurations in which change-over switches 607, 608, i.e., the third embodiment according to the present invention, are connected to the input and output of the variable gain amplifier 603. Since FIG. 6B is opposite to FIG. 6C in the connection relationship of the change-over switches 607 and 608, an output voltage of the offset voltage source 606 is transmitted to an opposite terminal, i.e., to 604 in FIG. 6B and to 605 in FIG. 6C, while maintaining the connection relationship between the input and output terminals. Therefore, when the aforementioned change-over switches 607, 608 are periodically changed over, the output voltage of the offset voltage source 606 appears at the output terminals 604, 605 for the same time, so that the offset voltage between the output terminals becomes zero.

Figure 7:
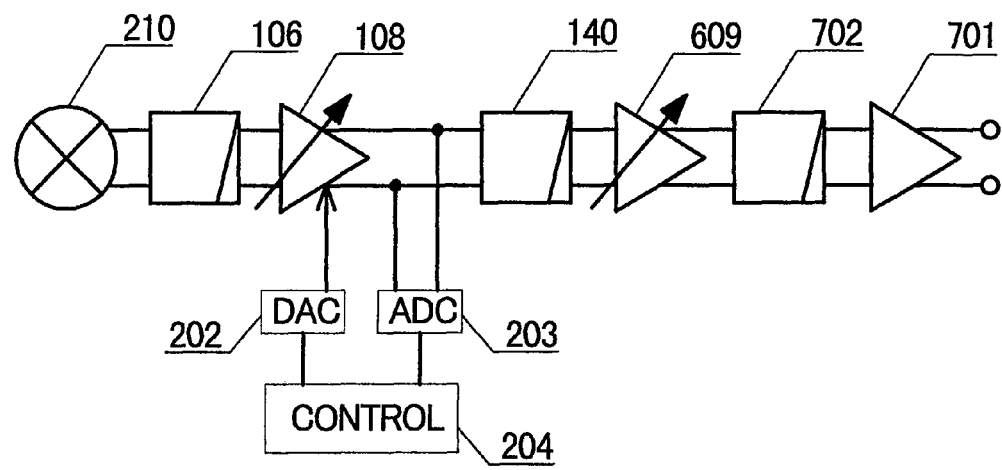
FIG. 7 is a block diagram illustrating an embodiment in which a chopper amplifier is applied to the receiver of the present invention.

Next, a receiver according to a fifth embodiment of the present invention will be described with reference to FIG. 7. This embodiment shows a receiver characterized in that the variable gain amplifier 609 shown in the third embodiment is employed in place of the variable gain amplifier 201 and the DC offset voltage canceling circuit 206 in the second embodiment, and a low pass filter 702 and a buffer amplifier 701 are connected subsequent to the variable gain amplifier 609.

Figure 8:
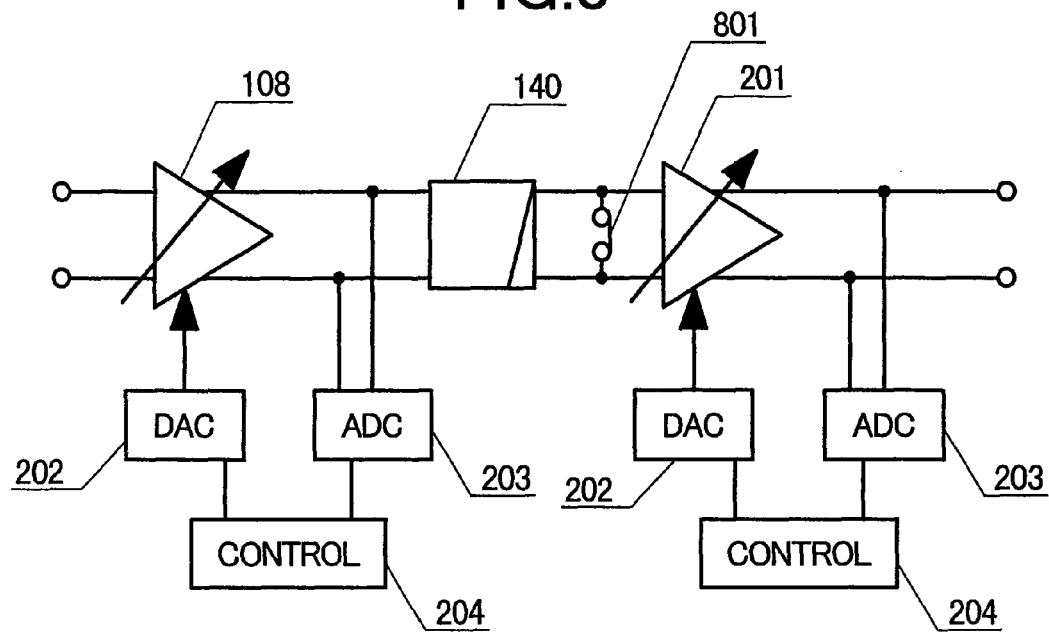
FIG. 8 is a block diagram illustrating a circuit for canceling a DC offset voltage for a variable gain amplifier without influence of a previous circuit in the receiver of the present invention.

Next, a receiver according to a sixth embodiment of the present invention will be described with reference to FIG. 8. This embodiment shows a receiver characterized in that a switch 801 is connected between the low pass filter 140 and the variable gain amplifier 201 in the second embodiment. For canceling a DC offset voltage, the switch 801 is turned on to short-circuit inputs of the variable gain amplifier 201, and the switch 801 is maintained off when the cancellation is not performed. By turning on the switch 801 upon starting the cancellation, the variable gain amplifier 201 can perform the cancellation without being affected by a DC offset voltage from the previous stage.

Figure 9:
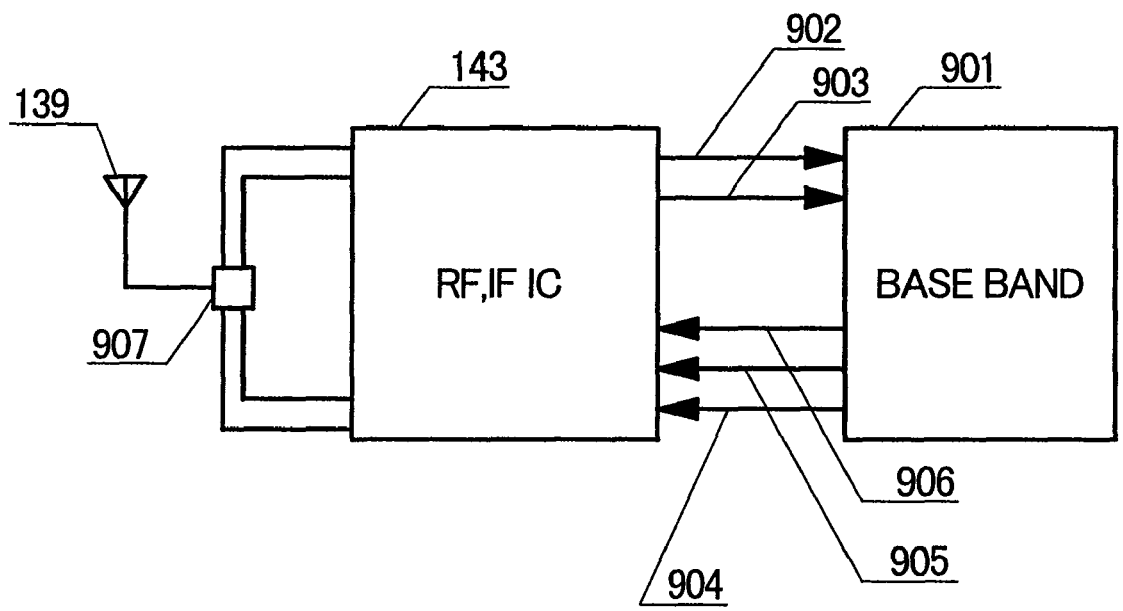
FIG. 9 is a block diagram showing that a timing signal for removing a DC offset can be provided from a baseband circuit.
Figure 10A:
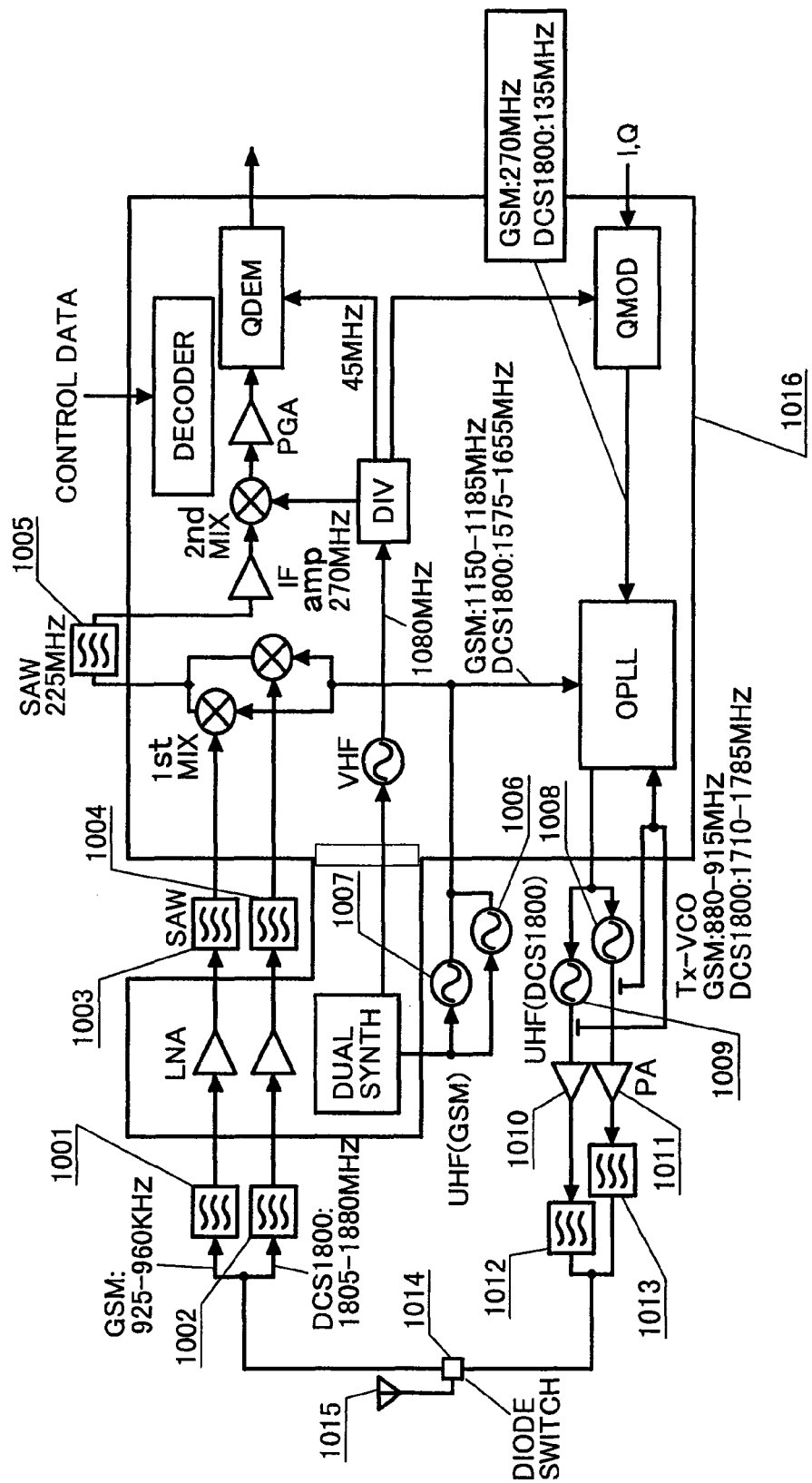
FIG. 10A is a block diagram illustrating the configuration of a mobile communication apparatus to which a conventional superheterodyne scheme is applied.
Figure 10B:
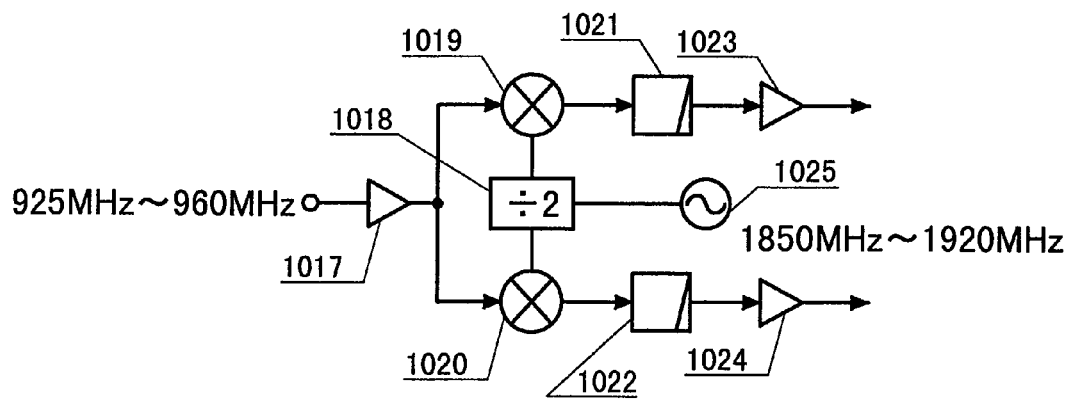
FIG. 10B is a block diagram illustrating the configuration of a prior art direct conversion receiver.
Figure 11:
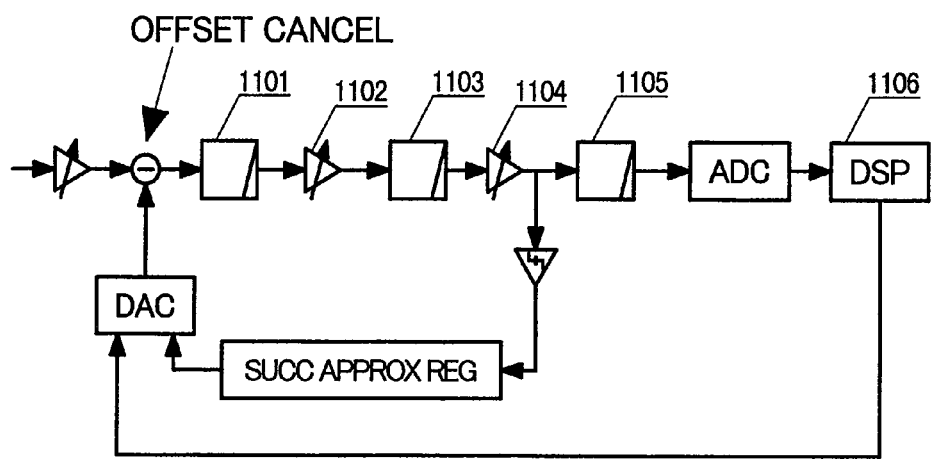
FIG. 11 shows a prior art DC offset voltage canceling technique.

Next, a mobile communication apparatus according to a seventh embodiment of the present invention will be described with reference to FIG. 9. This embodiment shows a mobile communication apparatus characterized in that a baseband circuit 901 is added to the first embodiment. A block 907 includes all circuits other than an antenna 139 and a circuit 143 contained in IC in the first embodiment. The baseband circuit 901 performs signal processing such as conversion of received baseband signals 902, 903 to audio signals, conversion of audio signals to transmission baseband signals 905, 906, and so on. Further, the baseband circuit 901 outputs a DC offset cancel starting signal 904 for determining the timing at which a DC offset voltage is canceled in the circuit 143, and inputs the signal 904 to the circuit 143. The starting signal is sent before a receiver starts receiving a signal, such that a DC offset generated in the circuit 143 is removed before receiving the signal.

Figure 14:
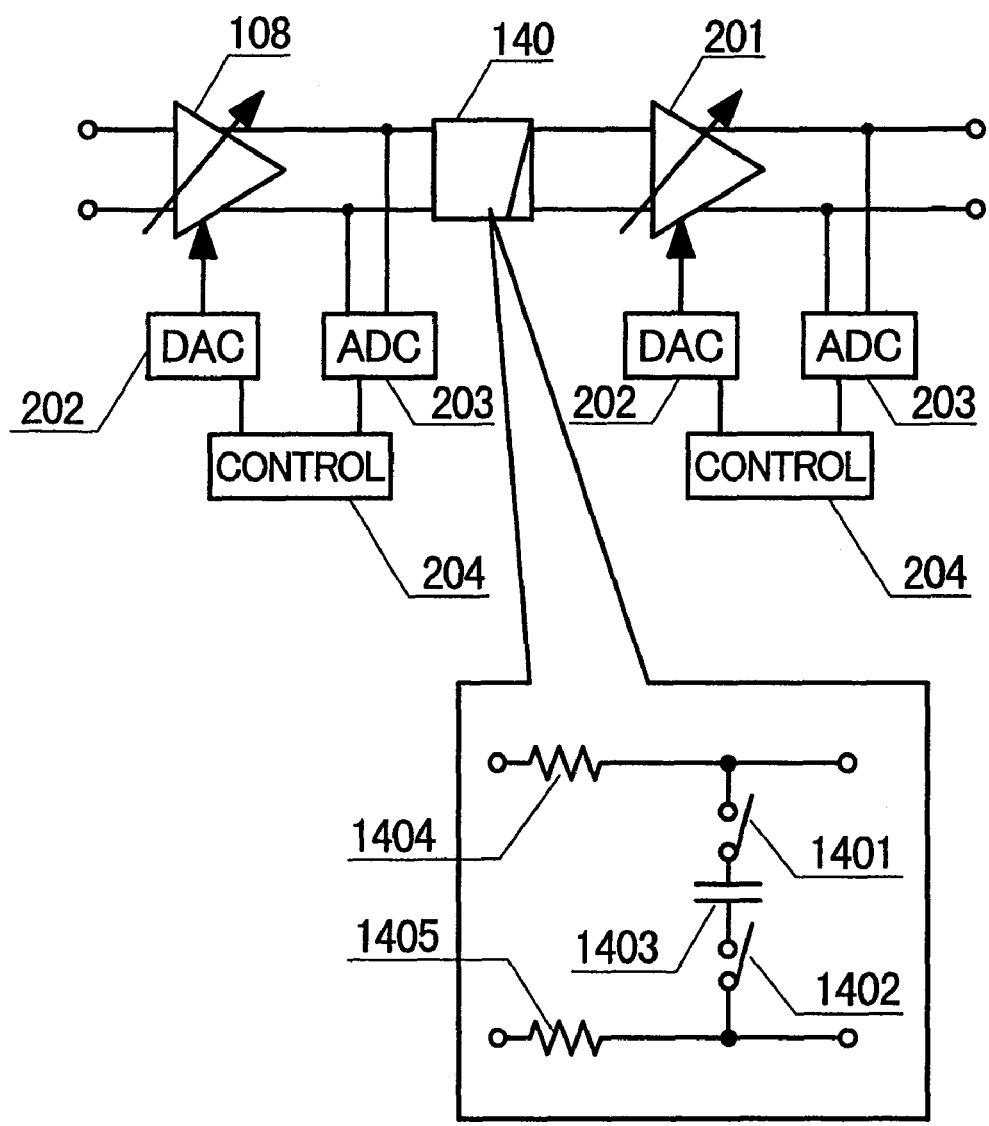
FIG. 14 shows a method of decoupling a filter capacitance to accelerate a DC offset removing operation.

Next, a mobile communication apparatus according to an eighth embodiment of the present invention will be described with reference to FIG. 14. Switches 1401, 1402 are inserted between a capacitance 1403 and resistors 1404, 1405 in a filter 140 to reduce the time constant during DC offset cancellation. Since this can reduce a propagation delay through the filter 140, the DC offset can be canceled faster without using the input short-circuiting switch 801 illustrated in FIG. 8. Also, when respective amplifiers 108, 201 are comprised of bipolar transistors as illustrated in FIG. 3, the bases of the transistors are biased through filter resistors 1404, 1405. Therefore, the DC offset voltage can be canceled, including a bias offset due to variations in base current and variations in filter resistor. On the other hand, the sixth embodiment employing the short-circuiting switch 801 cannot cancel the bias offset. In addition, when the DC offset is removed in order from former stages, a residual error is removed by the DC offset canceling function at a later stage, so that a more accurate DC offset removal can be achieved.

Figure 15:
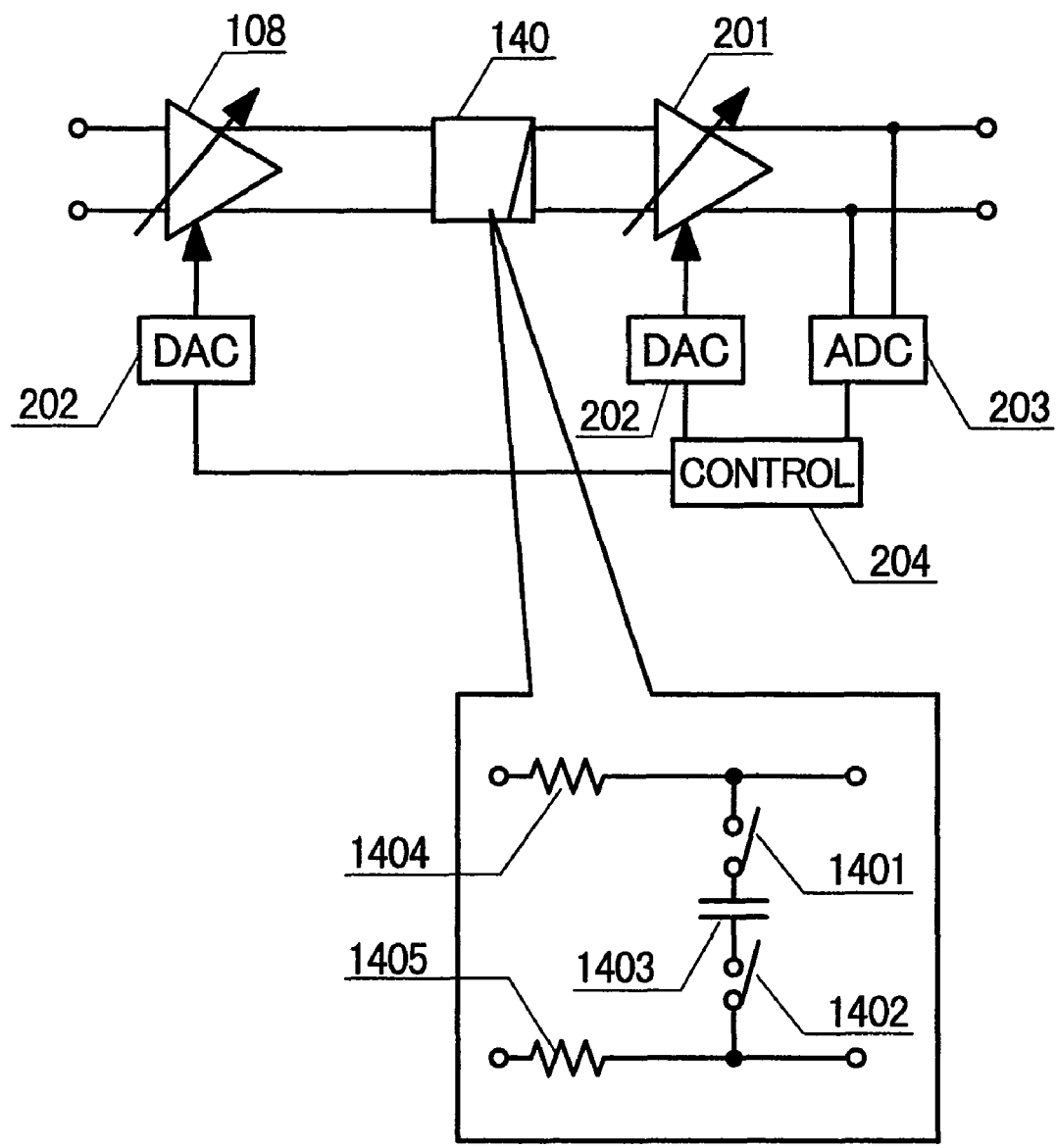
FIG. 15 shows a method of decoupling a filter capacitance to simplify a DC offset removing circuit.

Next, a mobile communication apparatus according to a ninth embodiment of the present invention will be described with reference to FIG. 15. When a propagation delay through the filter is reduced as in the eighth embodiment, the filter can be interposed in a feedback loop for canceling the DC offset voltage. Therefore, this embodiment can reduce the number of ADCs and accordingly the scale of the circuit, as compared with the eighth embodiment.

According to the present invention, three externally connected filters and one externally connected VCO can be saved as compared with the conventional superheterodyne receiver. In addition, it is possible to realize a mobile communication apparatus which can support a high speed packet transmission mode with a reduced number of parts by removing fast a DC offset voltage which causes a problem in the direct conversion receiver.

The invention claimed is:

1. A receiver for wireless communication, said receiver comprising:
   a first variable gain low pass filter that receives a baseband signal and includes a combination of a first variable gain amplifier and a first low pass filter coupled to each other in series;
   a first offset voltage canceling circuit that receives an output signal of said first variable gain amplifier and cancels an offset voltage of said first variable gain low pass filter;
   a second variable gain low pass filter that receives an output signal of said first variable gain low pass filter and includes a combination of a second variable gain amplifier and a second low pass filter coupled to each other in series; and
   a second offset voltage canceling circuit that receives an output signal of said second variable gain amplifier and cancels an offset voltage of said second variable gain low pass filter,
   wherein said first offset voltage canceling circuit cancels the offset voltage of said first variable gain low pass filter previously to said second offset voltage canceling circuit canceling the offset voltage of said second variable gain low pass filter
   wherein each of said first and second offset voltage canceling circuits comprises:
   an analog-to-digital converter (ADC) that receives an output signal of a respective one of said first and second variable gain amplifiers and converts the respective one in analog to the respective one in digital;
   a controller that receives an output signal of said ADC and detects an offset voltage of the respective one of said first and second variable gain amplifiers from the output signal of said ADC to output a digital signal for canceling the offset voltage of the respective one of said first and second variable gain low pass filters; and a digital-to-analog converter (DAC) that receives the digital signal outputted from said controller to output an analog signal corresponding to the digital signal for canceling the offset voltage to the respective one of said first and second variable gain amplifier, wherein said first variable gain low pass filter is configured of a differential circuit, wherein said first low pass filter includes first and second switches and a first capacitor, wherein said first switch is connected between a first signal wire of said differential circuit and said first capacitor, wherein said second switch is connected between a second signal wire of said differential circuit and said first capacitor, and wherein said first and second switches are switched to a short-circuited state or to an open state in synchronism through switching control.

2. The receiver according to claim 1, wherein said controller comprised in said first offset voltage canceling circuit is identical to said controller comprised in said second offset voltage canceling circuit, and wherein said second variable gain amplifier is connected subsequently to said first low pass filter.

* * * * *

UNITED STATES PATENT AND TRADEMARK OFFICE
CERTIFICATE OF CORRECTION

PATENT NO. : 8,107,912 B2
APPLICATION NO. : 12/975488
DATED : January 31, 2012
INVENTOR(S) : S. Tanaka et al.

Page 1 of 1

It is certified that error appears in the above-identified patent and that said Letters Patent is hereby corrected as shown below:

ON THE TITLE PAGE

Please correct (73) Assignees, as follows:

(73) Assignees: Renesas Electronics Corporation, Kanagawa (JP); ~~Tipcom~~ TTPCom Limited, Melbourn (GB)

Signed and Sealed this
Seventeenth Day of April, 2012

David J. Kappos
*Director of the United States Patent and Trademark Office*